US006524662B2

(12) United States Patent
Jang et al.

(10) Patent No.: US 6,524,662 B2
(45) Date of Patent: *Feb. 25, 2003

(54) METHOD OF CRYSTALLIZING AMORPHOUS SILICON LAYER AND CRYSTALLIZING APPARATUS THEREOF

(75) Inventors: Jin Jang, 102-1103, Hyundae Apt. 53, Jamwon-dong, Seocho-ku, Seoul (KR); Soo-Young Yoon, Daejeon (KR); Jae-Young Oh, Jeju-shi (KR); Woo-Sung Shon, Seoul (KR); Seong-Jin Park, Seoul (KR)

(73) Assignees: Jin Jang, Seoul (KR); LG. Philips LDC Co., LTD, Seoul (KR)

( * ) Notice: Subject to any disclaimer, the term of this patent is extended or adjusted under 35 U.S.C. 154(b) by 0 days.

This patent is subject to a terminal disclaimer.

(21) Appl. No.: 09/350,816

(22) Filed: Jul. 9, 1999

(65) Prior Publication Data

US 2002/0098297 A1 Jul. 25, 2002

(30) Foreign Application Priority Data

Jul. 10, 1998 (KR) .............................................. 98/27715
Oct. 21, 1998 (KR) .............................................. 98/44229

(51) Int. Cl.$^7$ ................................................ H05H 1/00
(52) U.S. Cl. ..................... 427/535; 427/532; 427/543; 427/576; 438/798; 438/797; 438/763; 117/8; 117/103; 117/108
(58) Field of Search ................................ 427/535, 543, 427/546, 545, 532, 575, 576; 438/798, 797, 763; 117/103, 108, 8

(56) References Cited

U.S. PATENT DOCUMENTS

| 4,309,225 A | * | 1/1982 | Fan et al. ..................... 427/555 |
| 4,626,448 A | * | 12/1986 | Hays ........................... 427/576 |
| 5,147,826 A | * | 9/1992 | Liu et al. |
| 5,275,851 A | * | 1/1994 | Fonash et al. ............... 427/578 |
| 5,364,664 A | * | 11/1994 | Tsubouchi et al. .......... 427/546 |
| 5,403,763 A | | 4/1995 | Yamazaki ..................... 437/44 |
| 5,403,772 A | | 4/1995 | Zhang et al. ................ 437/101 |
| 5,426,064 A | | 6/1995 | Zhang et al. ................ 437/40 |
| 5,481,121 A | | 1/1996 | Zhang et al. ................ 257/64 |
| 5,488,000 A | | 1/1996 | Zhang et al. ................ 437/21 |
| 5,492,843 A | * | 2/1996 | Adachi et al. ............... 117/106 |
| 5,501,989 A | | 3/1996 | Takayama et al. ............ 437/21 |
| 5,508,533 A | | 4/1996 | Takemura ..................... 257/64 |
| 5,529,937 A | | 6/1996 | Zhang et al. ................ 437/10 |
| 5,534,716 A | | 7/1996 | Takemura ..................... 257/72 |
| 5,543,352 A | | 8/1996 | Ohtani et al. ............... 437/101 |
| 5,550,070 A | * | 8/1996 | Funai et al. ................... 117/8 |
| 5,569,610 A | | 10/1996 | Zhang et al. ................ 437/21 |
| 5,576,222 A | | 11/1996 | Arai et al. ..................... 437/4 |
| 5,619,044 A | * | 4/1997 | Makita et al. ................ 257/64 |
| 5,639,698 A | * | 6/1997 | Yamazaki et al. ........... 117/930 |
| 5,663,077 A | * | 9/1997 | Adachi et al. ............... 438/762 |
| 5,677,240 A | | 10/1997 | Murakami et al. ........... 437/195 |
| 5,985,741 A | | 11/1999 | Yamazaki et al. ........... 437/487 |
| 6,066,547 A | | 5/2000 | Maekawa ..................... 438/486 |

FOREIGN PATENT DOCUMENTS

| JP | 2-140915 | 5/1990 |
| JP | 8-006053 | 1/1996 |
| KR | 97-1608 | 1/1997 |

OTHER PUBLICATIONS

Lerner Et Al, eds., *Encyclopedia of Physics*, 2$^{nd}$ed., VCH Publishers, Inc., New York, Excerpts pp. 294–297, esp.p. 296, 1990 No month.*
Hellund, *The Plasma State*, Reinhold Pub. Corp., New York, Excerpt From Chp. I (Fundementals) pp. 17–18, 1961 No month.*
Seung–Ik Jun, Et Al, "Fabrication of Low Temperature Poly–Silicon Thin Film Transistor Using Field Aided Lateral Crystallization (FALC)", Abstract for AEPSE'97, Korea, Oct. 5–9, 1997.*
Jang Et Al, "Electric–Field–Enhanced Crystallization of Amorphous Silicon", *Nature* 395, pp. 481–483, Oct. 1, 1998.*
K.S. Song, S. H. Park, S. I. Jun & D. K. Choi, "*Crystallization of the Amorphous Silicon Using Field Aided Lateral Crystallization*", Feb. 1997; pp. 144–150 Only Abstract In English.
S. I. Jun, et al. "*Effect of Ni and Al on the Low Temperature Field Aided Lateral Crystallization (FALC)*", Abstracts:*Materials Research Society*, Apr. 1998; p. 55 Abst. #B10.19.
K. S. Song & D. K. Choi, "*Electric Field Effect on the Metal Induced Crystallization of Amorphous Silicon*", The Electrochemical Society, Inc., Proceedings of the 8$^{th}$ International Symposium, Proceedings vol. 97–23, pp. 75–80, Conference–Paris France, Aug. 31–Sep., 5, 1997.
K. S. Song, S. H. Park, S. I. Jun & D. K. Choi, "*I–V Characteristics of Poly–Silicon Thin Film Transistors By Field Aided Lateral Crystallization (FALC)*", 5$^{th}$ International Conference on VSLI and CAD, Oct., 1997; pp. 187–189.

(List continued on next page.)

Primary Examiner—Marianne Padgett
(74) Attorney, Agent, or Firm—McKenna Long & Aldridge LLP (57) ABSTRACT

The present invention is related to a method of crystallizing an amorphous silicon layer and a crystallizing apparatus thereof which crystallize an amorphous silicon layer using of electric fields and plasma. The present invention includes the steps of depositing an inducing substance for silicon crystallization on an amorphous silicon layer by plasma exposure, and carrying out annealing on the amorphous silicon layer while applying an electric field to the amorphous silicon layer. The present invention includes a chamber having an inner space, a substrate support in the chamber wherein the substrate support supports a substrate, a plasma generating means in the chamber wherein the plasma generating means produces plasma inside the chamber, an electric field generating means in the chamber wherein the electric field generating means applies electric field to the substrate, and a heater at the substrate support wherein the heater supplies the substrate with heat.

12 Claims, 7 Drawing Sheets

OTHER PUBLICATIONS

S. I. Jun, Et Al, *"Fabrication of Low Temperature Poly–Silicon Thin Film Transistor Using Field Aided Lateral Crystallization (FALC)"*, The $1^{st}$ Asian–European International Conference on Plasma Surface Engineering, Oct. 5–9, 1997 Onepage, Left Hand Side Miss Part Of $1^{st}$ Words in Lines.

K. S. Song, S. H. Park, S. I. Jun & D. K. Choi, *"Enhanced Crystallization of Amorphous Silicon Using Electric Field"*, Proceedings of the $12^{th}$ KACG Technical Meeting; p. 243 No date.

Y. Masaki, P. G. LeComber & A. G. Fitzgerald, *"Solid Phase Crystallization of Thin Films of Si Prepared by Plasma–Enhanced Chemical Vapor Deposition"*, J. App. Physics. 74(1), Jul., 1993; pp. 129–134.

D. K. Sohn, J. N. Lee, S. W. Kang & B. T Anh, *"Low Temperature Crystallization of Amorphous Si Films by Metal Adsorption and Diffusion"*, Jpn. J. Appl. Phys. vol. 34 (1996); pp. 1005–1009 No month.

J. I. Ryu, H. C. Kim, S. K. Kim & J. Jang, *"A Novel Self–Aligned Polycrystalline Silicon Thin–Film Transistor Using Silicide Layers"*, IEEE Electron Device Letters, vol. 18, No. 6, Jun., 1997; pp. 123–125.

Y. Kawazu, H. Kudo, S. Onari & T. Arai, *"Low Temperature Crystallization of Hydrogenated Amorphous Silicon Induced by Nickel Silicide Formation"*, Jpn. J. Appl. Phys. vol. 29, No. 12, Dec., 1990; pp. 2698–2704.

U.S. patent application Ser. No. 09/115,498, Jang et al., filed Apr. 14, 1998.

U.S. patent application Ser. No. 09/170,625, Choi, filed Oct. 13, 1998.

U.S. patent application Ser. No. 09/299,571, Jang et al., filed Apr. 27, 1999.

\* cited by examiner

METHOD OF CRYSTALLIZING AMORPHOUS SILICON LAYER AND CRYSTALLIZING APPARATUS THEREOF

This application claims the benefit of Korean Patent Application Nos. 98-27715 filed on Jul. 10, 1998 and 98-44229 filed on Oct. 21, 1998, which is hereby incorporated by reference.

BACKGROUND OF THE INVENTION

1. Field of Invention

The present invention relates to a method of crystallizing an amorphous silicon layer and a crystallizing apparatus thereof in which the amorphous silicon layer is crystallized by using electric fields and plasma.

1. Discussion of Related Art

In view of performance, low temperature polysilicon, of which product cost is low owing to its low formation temperature and which also provides wide image area, is as good as high temperature polysilicon. There are various methods for forming low temperature polysilicon, such as solid phase crystallization, laser crystallization and the like.

When providing low temperature crystallization under 400° C., which is disclosed in Hiroyaki Kuriyama, et al., *Jpn. J. Appl. Phys.*, 31, 4550 (1992), the laser crystallization fails to provide uniform crystallization and has difficulty in forming polysilicon on a substrate having a wide area due to an expensive apparatus and low productivity.

When polysilicon is formed by solid phase crystallization, uniform crystals are provided by using an inexpensive apparatus. However, the solid phase crystallization requires high temperature and long crystallization processing time. Such process is seldomly applied to forming polysilicon on a glass substrate and has low productivity.

A new method of crystallizing amorphous silicon at low temperature, known as metal-induced crystallization, is disclosed in M. S. Haque, et al., *J. Appl. Phys*, 79, 7529 (1996). The metal-induced crystallization crystallizes amorphous silicon by contacting amorphous silicon with a specific kind of metal which induces crystallization of silicon and then by:carrying out annealing, enabling lower crystallization temperature.

In Ni-induced crystallization, crystallization is accelerated by $NiSi_2$ which is the last phase of Ni silicide and works as a crystal nucleus, which is disclosed in C. Hayzelden, et al., *Appl. Phys. Lett.*, 60, 225 (1992). As a matter of fact, $NiSi_2$, which has a lattice constant of 5.406 Å similar to 5.430 Å of silicon, has the same structure as silicon. Thus, $NiSi_2$ works as a crystal nucleus of amorphous silicon, accelerating crystallization to the direction <111>, disclosed in Tanemasa Asano, et al., *Jpn. J. Appl. Phys.*, Vol. 36, pp.1415–1419 (1997).

The metal-induced crystallization is affected by annealing time and temperature as well as quantity of metal. The crystallization time generally decreases as the quantity of metal increases.

Metal-induced crystallization has a low crystallization temperature, but unfortunately requires a long thermal processing time of over 20 hours at 500° C. Therefore, this method still requires a high crystallization temperature as well as a long thermal process time.

As the quantity of metal increases, the metal-induced crystallization becomes more effective. However, intrinsic characteristics of a silicon layer are changed due to metal contamination in the crystallized silicon layer.

Accordingly, when metal-induced crystallization is used, an improved method is required which reduces thermal treatment time, crystallization temperature, and metal contamination in a film.

SUMMARY OF THE INVENTION

Accordingly, the present invention is directed to a method of crystallizing an amorphous silicon layer and a crystallizing apparatus thereof that substantially obviate one or more of the problems due to limitations and disadvantages of the related art.

The object of the present invention is to provide a method of crystallizing an amorphous silicon layer and a crystallizing apparatus thereof which accelerate the crystallization of amorphous silicon by use of plasma in an electric field while decreasing crystallization temperature.

Another object of the present invention is to provide a method of crystallizing an amorphous silicon layer and a crystallizing apparatus thereof which alleviate metal contamination in a crystallized silicon layer by controlling density and exposure time of plasma as well as forming metal-induced polysilicon on a glass substrate of a large area during a short period by applying an electrical field.

Additional features and advantages of the invention will be set forth in the description which follows and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, the present invention includes the steps of depositing an inducing substance for silicon crystallization on an amorphous silicon layer by plasma exposure, and carrying out annealing on the amorphous silicon layer while applying electric field to the amorphous silicon layer.

In another aspect, the present invention includes the steps of preparing a substrate on which an amorphous silicon layer is formed, depositing an inducing substance for silicon crystallization on the substrate by plasma exposure, and carrying out annealing on the substrate where the inducing substance is deposited while applying an electric field to the substrate.

In a further aspect, the present invention includes the steps of depositing an inducing substance for silicon crystallization on an amorphous silicon layer by plasma exposure as soon as annealing is carried out on the amorphous silicon layer while applying an electric field to the amorphous silicon layer.

In a further aspect, the present invention includes the steps of depositing an inducing substance for crystallization on an amorphous substance layer by plasma exposure, and carrying out annealing on the amorphous substance layer while applying an electric field to the amorphus substance layer.

In a further aspect, the present invention includes the steps of depositing an inducing substance for crystallization on an amorphous substance layer by plasma exposure, and carrying out annealing on the amorphous substance layer while applying an electric field to the amorphous substance layer.

In a further aspect, the present invention includes a chamber having inner space, a substrate support in the chamber wherein the substrate support supports a substrate, a plasma generating means in the chamber wherein the plasma generating means produces plasma inside the chamber, an electric field generating means in the chamber wherein the electric field generating means applies the electric field to the substrate, and a heater at the substrate support wherein the heater supplies the substrate with heat.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiments of the invention and together with the description serve to explain the principle of the invention.

In the drawings.

DETAILED DESCRIPTION OF PREFERRED EMBODIMENTS

Reference will now be made in detail to the preferred embodiments of the present invention, examples of which are illustrated in the accompanying drawings.

A method of crystallizing an amorphous silicon layer according to the present invention is characterized by crystallizing amorphous silicon within a short period at low temperature without metal contamination by means of accelerating crystallization of the layer by using both electric fields and plasma.

Formation of silicide, working as a crystal nucleus of silicon, is accelerated by an electric field, which is disclosed in H. Murakami, et al., *Appl. Surf. Sci.,* Vol. 117/118, pp. 289–293 (1997). Mobility of a Ni atom ionized in an electric field is fast and accelerates the formation of Ni silicide. Therefore, crystallization time is shortened by introduction of an electric field.

An amorphous silicon layer experiences crystallization by forming a semiconductor layer of amorphous silicon on an insulated substrate, such as quartz, glass, oxide or the like, by exposing the semiconductor layer to plasma generated by RF power or DC power and by carrying out annealing under an electric field and/or plasma, successively. Plasma induces silicon crystallization by having metal atoms inside a reaction chamber deposited on the amorphous silicon layer. In order to have a specific metal deposited on the amorphous silicon layer as plasma-exposed layer, plasma is generated from a metal bar or plate placed in the reaction chamber. In this case, noble metal or transition metal forming silicide such as Au, Ag, Al, Sb, In, Ni, Mo, Pd, Co, Ti, Cu, Fe, Cr or other materials known to one of ordinary skill in the art is used as metal substance.

Figure 1:
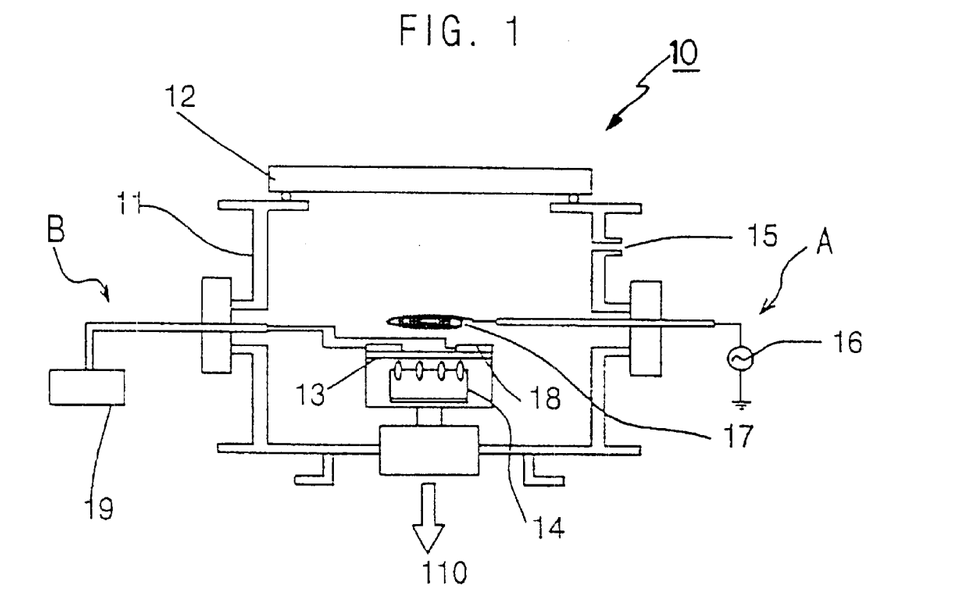
FIG. 1 shows a schematic drawing of an apparatus for crystallizing an amorphous silicon layer according to the present invention.

FIG. 1 shows a schematic drawing of a crystallization apparatus 10 for crystallizing an amorphous silicon layer according to the present invention. Referring to FIG. 1, in a reaction chamber 11, a substrate support 13 supports a substrate, which is exposed to plasma and on which metal atoms are deposited. In this case, an amorphous silicon layer is formed on the substrate, and a plasma generating device A and an electric field generating device B (which applies an electric field to the substrate) are placed in the reaction chamber 11 as well.

The plasma generating device A includes a metal bar 17 which becomes a metal source, working as a crystallization catalyst after being deposited on the amorphous silicon layer and being a path of supplying RF or DC power to generate plasma, and an RF/DC power supply 16 connected to the metal bar 17. The plasma generating device A may be substituted with other plasma inducing device known to one of ordinary skill in the art.

The electric field generating device B includes a DC/AC power supply 19, which is connected to both ends of the amorphous silicon layer on the substrate support 13 and supplies a predetermined DC or AC voltage to generate an electric field.

Placed in the reaction chamber 11 are a gas inlet 15 through which plasma source gases such as nitrogen or helium, a heater 14 under the substrate support 13 for annealing the substrate, and an outlet 110 through which remaining gases or plasma inside the reaction chamber 11 are exhausted in vacuum. A quartz window 12 covers an upper part of the reaction chamber 11.

An operating procedure of the crystallization apparatus 10 in the above description will be explained in the following description. An amorphous silicon layer formed on a substrate is placed on the substrate support 13. Then, gas, such as nitrogen or helium, is injected into the reaction chamber 11 through the gas inlet 15. Then, plasma is generated inside the reaction chamber 11 by supplying the metal bar 17 with RF or DC power by the RF/DC power supply 16 of the plasma generating device A. Plasma collides with the metal bar 17 as soon as portions of metal atoms of the metal bar 17 are deposited on the amorphous silicon layer, thereby forming a plasma-exposed layer on the amorphous silicon layer. In this case, the amount of metal of the plasma-exposed layer is controlled by adjusting RF or DC power, time during which the amorphous silicon layer is exposed to plasma, or deposition pressure.

As mentioned in the above description, plasma is generated inside the reaction chamber 11 through the metal bar or plate 17 in order to have specific species of metal deposited on the amorphous silicon layer by plasma. In this case, noble metal or transition metal forming silicide, such as Au, Ag, Al, Sb, In, Ni, Mo, Pd, Co, Ti, Cu, Fe, Cr or the like, is used as the metal substance and the metal bar 17 may have various forms and shapes, such as a mesh and the like.

For silicon crystallization, an electric field is produced by applying voltage at both ends of the amorphous silicon layer through the DC/AC power supply 19. Then, crystallization of the amorphous silicon is achieved by annealing, which supplies the substrate with heat through the heater 14 under the substrate support 13.

Applying an electric field in the heated substrate may be carried out after the plasma-exposed layer has been formed or contemporaneously with plasma exposure process. Namely, the amorphous silicon layer experiences crystallization by being subjected to a thermal treatment under an electric field after exposure of the semiconductor layer of amorphous silicon to RF or DC plasma by use of nitrogen or helium gas, or by applying an electric field and carrying out thermal treatment during exposure to RF or DC plasma. In order to apply an electric field to both ends of amorphous silicon, electrodes are provided by depositing metal on amorphous silicon or by placing an electrical conductor, such as a metal plate onto the amorphous silicon.

After crystallization or formation of a plasma-exposed layer, the remaining gas or plasma inside the reaction chamber 11 is exhausted in a vacuum through the outlet 110. In this case, temperature of thermal treatment may range about 300 to 1000° C. and crystallization temperature and time are reduced under about 400° C. and 10 minutes, respectively.

It is important for the present invention to generate uniform plasma inside a vacuum reaction chamber 11 as well as maintain uniform temperature all over an amorphous silicon layer on a large scale.

Figure 2:
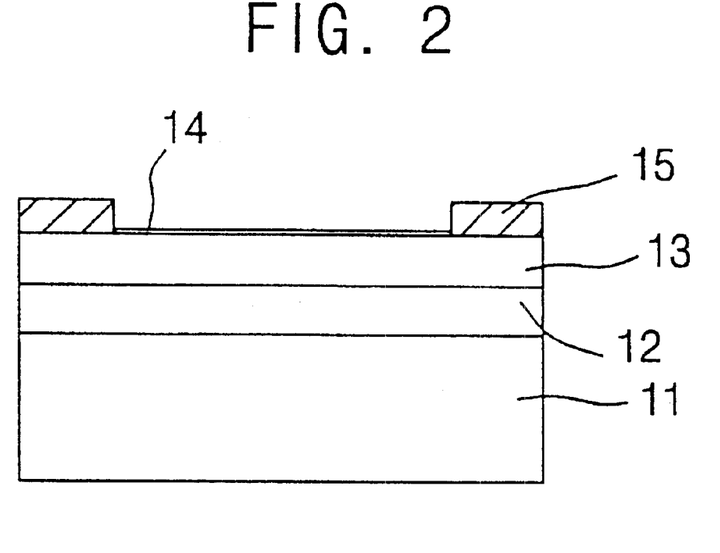
FIG. 2 shows a cross-sectional view of a substrate to crystallize an amorphous silicon layer according to a first embodiment of the present invention.
Figure 3:
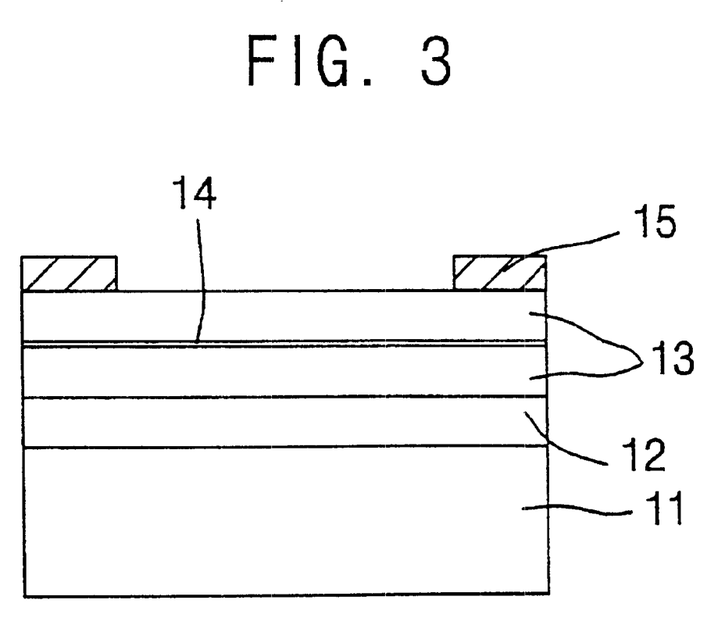
FIG. 3 shows a cross-sectional view of a substrate to crystallize an amorphous silicon layer according to a second embodiment of the present invention.
Figure 4:
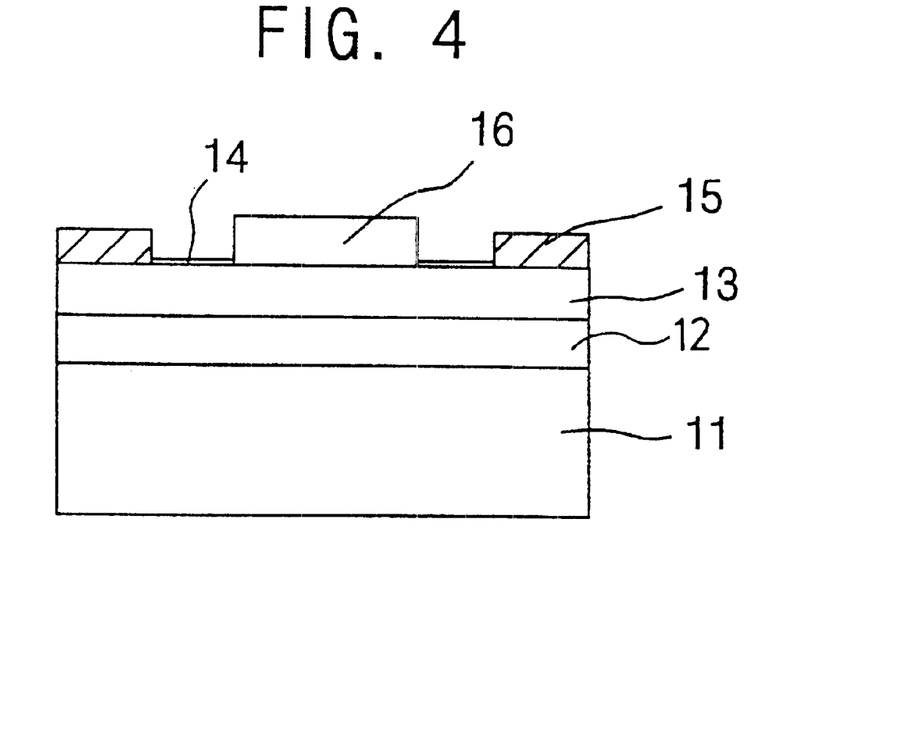
FIG. 4 shows a cross-sectional view of a substrate to crystallize an amorphous silicon layer according to a third embodiment of the present invention.

FIG. 2 shows a cross-sectional view of a substrate to crystallize an amorphous silicon layer according to a first embodiment of the present invention. FIG. 3 shows a cross-sectional view of a substrate to crystallize an amorphous silicon layer according to a second embodiment of the present invention. FIG. 4 shows a cross-sectional view of a substrate to crystallize an amorphous silicon layer according to a third embodiment of the present invention. The plasma-exposed layers in FIGS. 2–4 are formed by the crystallization apparatus explained in the above-mentioned description.

Referring to FIG. 2, a buffer layer 12 is formed on an insulated substrate 11. An amorphous silicon layer 13 is formed on the buffer layer 12. Electrodes 15 are formed on predetermined portions of the amorphous silicon layer 13. Then, a plasma-exposed layer 14 is formed by exposing the upper surface of the substrate to plasma.

Referring to FIG. 3, a buffer layer 12 is formed on an insulated substrate 11. An amorphous silicon layer 13 is formed on the buffer layer 12. Then, a plasma-exposed layer 14 is formed on the amorphous silicon layer 13 by plasma exposure. Then, another amorphous silicon layer 13 and electrodes 15 are formed, successively.

Referring to FIG. 4, a buffer layer 12 is formed on an insulated substrate 11. An amorphous silicon layer 13 is formed on the buffer layer 12. An insulating layer 16 having a predetermined pattern is formed on the amorphous silicon layer 13. A plasma-exposed layer 14 is formed on the exposed amorphous silicon layer 13 by plasma exposure. Then, electrodes 15 are formed on the amorphous silicon layer 13. In this case, the insulating layer 16 works as a mask for selectively exposing the amorphous silicon layer 13 to plasma.

In the above embodiments, the thickness of the plasma-exposed layers. 14 is controlled by adjusting RF or DC power, time during which the amorphous silicon layer is exposed to plasma, or deposition pressure. As an alternative embodiment, the buffer layer 12 may be eliminated from the embodiments of FIGS. 2–4.

Figure 5:
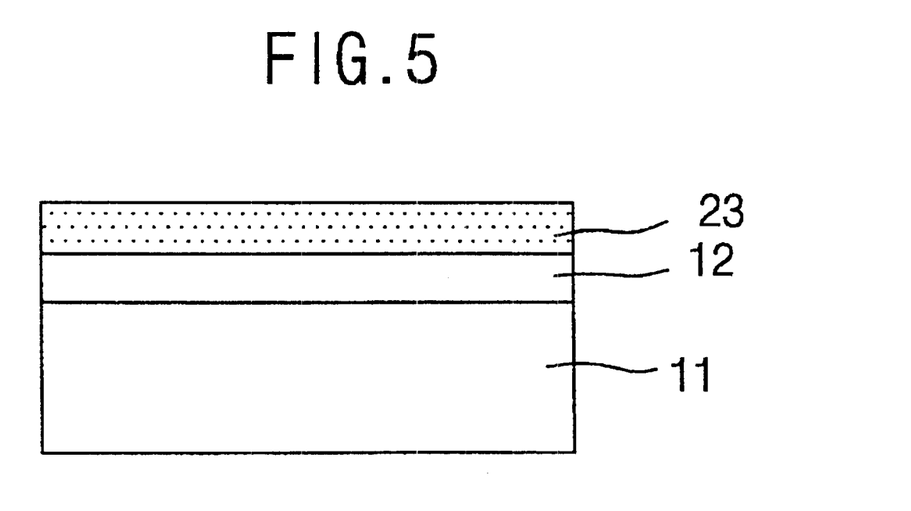
FIG. 5 shows a cross-sectional view of a substrate after crystallization of each amorphous silicon layer according to the first to third embodiments of the present invention.

FIG. 5 shows a cross-sectional view of a polysilicon layer and a glass substrate after crystallization of each amorphous silicon layer according to the first to third embodiments of the present invention. In FIG. 5, the cross-sectional view of the polysilicon layer without the electrodes 15 is shown. Referring to FIG. 5, the amorphous silicon layer 13, which was in contact with the plasma-exposed layer 14, is crystallized into a polysilicon layer 23. Thus, the polysilicon layer 23 is formed on the buffer layer 12 of the insulated substrate 11 according to each embodiment. In this case, plasma exposure may proceed during 0.1 to 1000 second(s) at 0.5 mTorr to 100 Torr, electric field 1 to 1000 V/cm may be applied by DC or AC, and plasma may be RF, DC or microwave plasma.

The embodiments of the present invention enable the control of the amount of metal substance to be deposited on the amorphous silicon layer 13, not by sputtering (which deposits a metal substance layer inducing silicon crystallization with bias voltage) but by plasma exposure, which deposits a metal substance without bias voltage, whereby it is easy to control the amount of metal substance to be deposited on the amorphous silicon layer 13. Forming a metal layer working as a catalyst for metal-induced crystallization by plasma exposure, the present invention reduces metal contamination of a crystallized silicon layer by avoiding the amorphous silicon layer from being contacted with massive metal, which is usually inevitable in the sputtering deposition.

Figure 6:
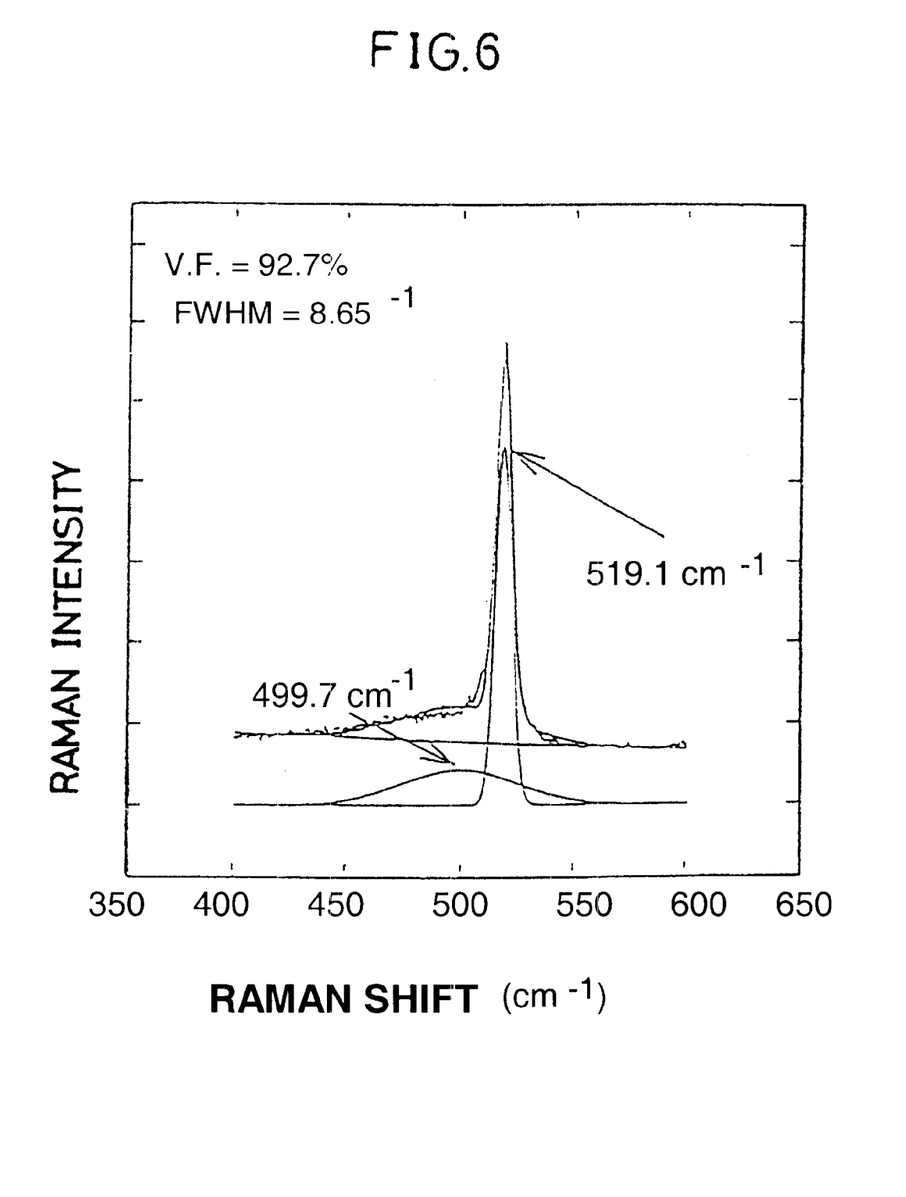
FIG. 6 shows Raman spectrum of a silicon layer crystallized at 460° C. according to the present invention.

FIG. 6 shows Raman spectrum of a silicon layer crystallized at 460° C. according to the present invention. Referring to FIG. 6, an electric field of 100V/cm is applied to both ends of amorphous silicon, and RF plasma of 20W and excited nitrogen gas are used. A sharp Raman peak near 520/cm by transverse optical phonon mode indicates a crystalline body while a broad Raman peak by micro crystalline particles appears near 500/cm. Crystallization degree (V.F) and FWHM are about 92.7% and 8.65/cm, respectively. carried out for about 20 minutes at 460° C.

Figure 7:
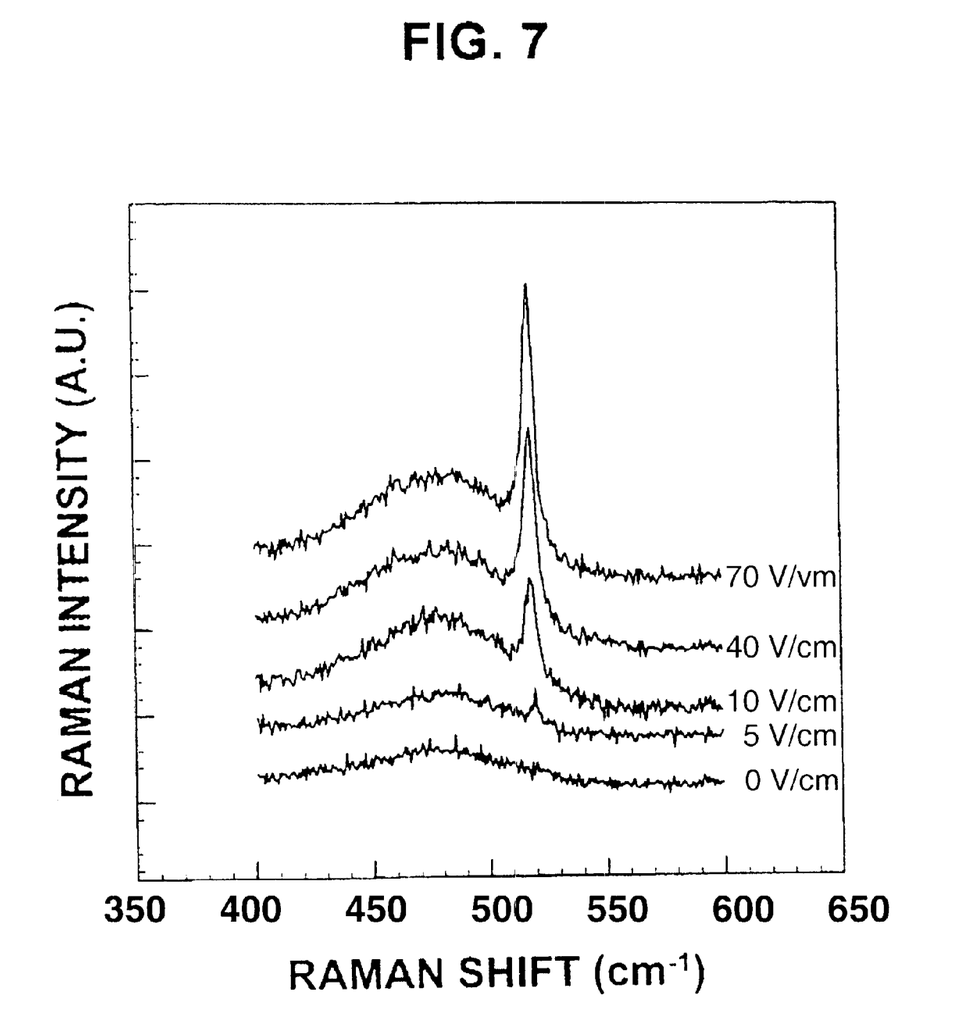
FIG. 7 shows Raman spectrum of the silicon layers crystallized by the present invention in accordance with intensity of electric fields.

FIG. 7 shows Raman spectra of the silicon layers crystallized by the embodiments of the present invention in accordance with the intensity of an electric field. Referring to FIG. 7, exposure time to plasma is about 5 minutes. All the amorphous silicon layers are exposed to plasma at 100° C. to avoid heat conduction caused by plasma through the silicon layers. Then, electric fields of 70V/cm, 40V/cm, 10V/cm, 5V/cm and 0V/cm by DC power are applied to both ends of the amorphous silicon layer without plasma, respectively, and carrying out thermal treatment for about 20 minutes at 460° C.

Figure 8:
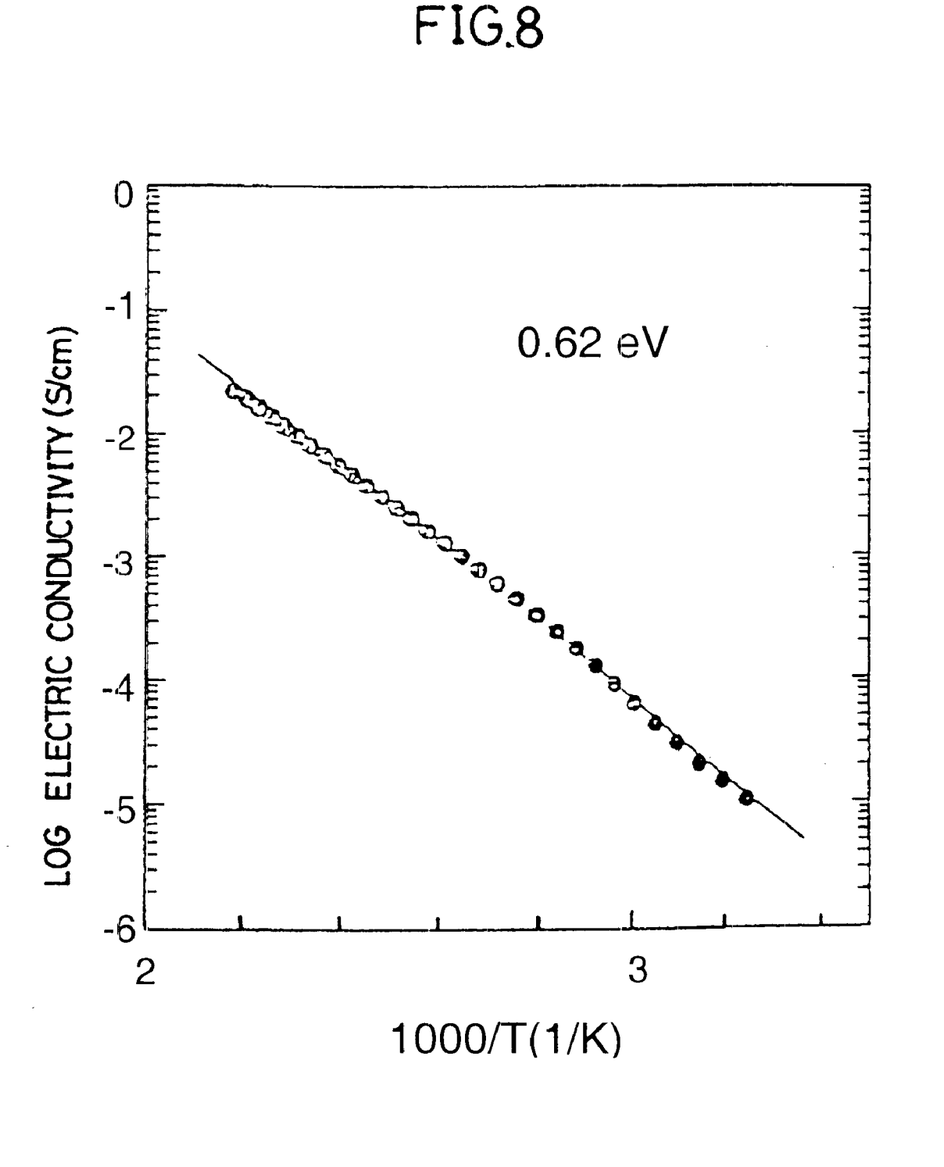
FIG. 8 shows electric conductivity of a silicon layer crystallized by the present invention.

In both cases, a sharp Raman peak near 520/cm by transverse optical phonon mode indicates a crystalline body, while a small broad Raman peak by microcrystalline particles appears near 500/cm. With increasing electric field strength, the crystalline peak intensity increases. The Raman peak appears when electric field of 5V/cm is applied to both ends of the amorphous silicon layer FIG. 8 shows electric conductivity of a silicon layer crystallized by the present invention. Referring to FIG. 8, after 5 minutes of plasma exposure, crystallization is carried out for about 10 minutes at 500° C., and an electric field of 20V/cm is applied to both ends of amorphous silicon. Each electrical conductivity activation energy of the crystallized polysilicon layer is 0.62 eV, and room temperature electrical conductivity after crystallization is $10^{-6}$ S/cm. There shows no hooping, but there are activated forms such as ELA (excimer laser annealing) poly-Si.

Figure 9:
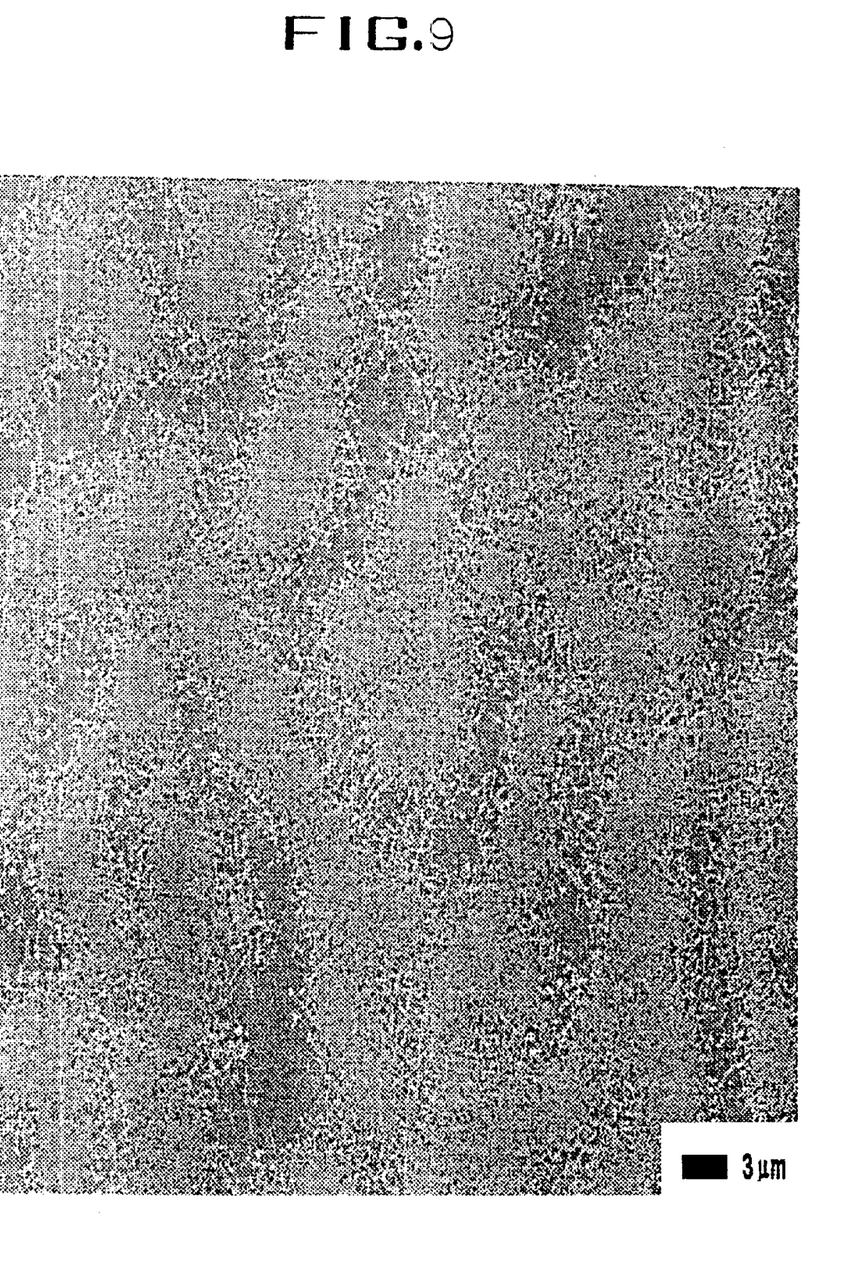
FIG. 9 shows an SEM photograph of a polysilicon layer crystallized at 420° C. by the present invention.

FIG. 9 shows a SEM (scanning electron microscopy) photograph of a polysilicon layer crystallized at 420° C. by the embodiment of the present invention. Referring to FIG. 9, crystallization is carried out by applying a DC electric field of 100V/cm, while temperature and time of thermal treatment are 420° C. and 30 minutes, respectively. To make the shade difference between amorphous and crystalline silicon clear, the amorphous phase is selectively etched to be observed by secco etching.

A light region constitutes crystalline, broadening its crystalline region as pin shapes form a network. Dark region not yet crystallized indicates amorphous. The rest of the amorphous region becomes fully crystallized as thermal treatment time increases.

As a result of the present invention wherein crystallization is carried out at about 300 to 1000° C., the whole layer is crystallized within a short period of less than 50 minutes under a thermal treatment. Metal contamination of the crystallized layer is greatly reduced by adjusting the amount of metal in the layer in accordance with plasma exposure time. Moreover, crystallization of amorphous silicon is achieved at about 400° C. Crystallization of the whole layer is completed within a short period such as 10 minutes, as well as metal contamination of the crystallized layer is greatly reduced by adjusting the amount of metal in the layer in accordance with plasma exposure time. It is possible to carry out successive deposition, crystallization and another deposition, provided that electrodes are placed in a plasma chemical vapor chamber and specific metal species separated from the electrodes are deposited by plasma. Therefore, interface characteristics are improved when semiconductor devices are fabricated.

The principle of the present invention is also applied to SRAM, solar cells and thin film transistors as drivers of a liquid crystal display.

It will be apparent to those skilled in the art that various modifications and variations can be made in a method of crystallizing an amorphous silicon layer and a crystallizing apparatus thereof of the present invention without departing from the spirit or scope of the invention. Thus, it is intended that the present invention covers the modifications and variations of this invention provided they come within the scope of the appended claims and equivalents.

What is claimed is:

1. A method for forming a polycrystalline silicon layer comprising the steps of:

forming an amorphous silicon layer on a substrate;

connecting a first terminal and a second terminal of an electric power supply to the amorphous silicon layer, the first terminal and the second terminal being spaced apart;

depositing a crystallization catalyst on the amorphous silicon layer by plasma exposure; and simultaneously heating the amorphous silicon layer with a heat source different from the electric power supply and applying a voltage from the electric power supply across the first terminal and the second terminal.

2. The method of claim 1, wherein the power supply is an alternating current power supply.

3. The method of claim 1, wherein the power supply is a direct current power supply.

4. The method of claim 1, wherein the depositing step is performed during the performance of the heating and applying steps.

5. The method of claim 1, wherein the crystallization catalyst is a metal.

6. The method of claim 5, wherein the crystallization catalyst is a noble metal.

7. The method of claim 5, wherein the crystallization catalyst is a transition metal.

8. The method of claim 1, wherein the depositing step is performed before the heating and applying steps.

9. The method of claim 1, wherein the substrate has a first end and a second end and the first terminal is connected to the amorphous silicon layer at the first end and the second terminal is connected to the second end.

10. The method of claim 1, further comprising a step of forming a first electrode and a second electrode over the substrate, the first electrode and the second electrode being electrically connected to the amorphous silicon layer, the first terminal being connected to the amorphous silicon layer through the first electrode, and the second terminal being connected to the amorphous silicon layer through the second electrode.

11. The method of claim 10, further comprising the step of forming an insulating layer having a pattern over the amorphous silicon layer prior to the depositing step, the pattern being such that a first portion of the amorphous silicon layer is covered by the insulating layer and a second portion of the amorphous silicon layer is not covered by the insulating layer so that no crystallization catalyst is deposited on the first portion during the depositing step.

12. The method of claim 1, wherein the substrate includes a buffer layer formed thereon.

* * * * *

UNITED STATES PATENT AND TRADEMARK OFFICE
CERTIFICATE OF CORRECTION

PATENT NO.     : 6,524,662 B2                                              Page 1 of 1
DATED          : February 25, 2003
INVENTOR(S)    : Jin Jang et al.

It is certified that error appears in the above-identified patent and that said Letters Patent is hereby corrected as shown below:

<u>Title page,</u>
Item [73], Assignees, please insert the following data:
-- Jin Jang, Seoul (KR); LG.Philips LCD Co., Ltd., Seoul (KR) --

Signed and Sealed this

Sixteenth Day of March, 2004

JON W. DUDAS
*Acting Director of the United States Patent and Trademark Office*